United States Patent
Shim et al.

(10) Patent No.: US 6,268,810 B1
(45) Date of Patent: Jul. 31, 2001

(54) METHOD OF GENERATING RUN LENGTH LIMITED (RLL) CODE HAVING IMPROVED DC SUPPRESSION CAPABILITY AND MODULATION/DEMODULATION METHOD OF THE GENERATED RLL CODE

(75) Inventors: Jae-seong Shim, Seoul; Yong-kwang Won, Suwon, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/522,446

(22) Filed: Mar. 9, 2000

(30) Foreign Application Priority Data

Mar. 9, 1999 (KR) .................................................. 99-7723

(51) Int. Cl.$^7$ ...................................................... H03M 7/00
(52) U.S. Cl. .............................. 341/59; 341/341; 341/58; 341/106
(58) Field of Search ................................. 341/59, 60, 61, 341/67, 50, 106, 95, 58; 369/59, 275.3

(56) References Cited

U.S. PATENT DOCUMENTS 5,696,505 * 12/1997 Schouhamer Immink ............ 341/59
5,790,056 * 8/1998 Schouhamer Immink ............ 341/58
5,818,367 * 10/1998 Okazaki et al. ..................... 341/106

\* cited by examiner

Primary Examiner—Michael Tokar
Assistant Examiner—John Nguyen
(74) Attorney, Agent, or Firm—Staas & Halsey LLP

(57) ABSTRACT

A method of generating a run length limited (RLL) code having improved direct current (DC) suppression capability and modulation and demodulation methods of the generated RLL code. According to the method of generating the RLL codes, code words that satisfy a (d, k) run length constraint are generated. By allocating main code groups, in which a code word can be duplicated depending on the characteristics of the generated codeword and code words of each main code group are allocated in consideration of a code word sum value (CSV) parameter, which represents the DC value in a code word, and an inverse characteristic of an INV parameter, which predicts the transition direction of digital sum value (DSV) of the next code word, and allocating decision groups for differentiating the duplicated code words, by using some of the code words, which are already used in main code group, as code words for DSV groups for the DC suppression, the number of code word bits can be reduced and the recording density increases, while improving the DC suppression capability.

35 Claims, 14 Drawing Sheets

FIG. 1A (PRIOR ART)

MAIN CONVERSION TABLE

|   | CODE GROUP 1 | CODE GROUP 2 | CODE GROUP 3 | CODE GROUP 4 |
|---|---|---|---|---|
| 0 | 00100000000001001 | 01000000100100000 | 00100100010001001 | 01000000100100000 |
| ≀ | ≀ | ≀ | ≀ | ≀ |
| 255 | 00000001000001000 | 01000001000010010 | 10001001000010000 | 01000001000010010 |

FIG. 1B (PRIOR ART)

SUB CONVERSION TABLE (FOR DC CONTROL)

|   | CODE GROUP 1 | CODE GROUP 2 | CODE GROUP 3 | CODE GROUP 4 |
|---|---|---|---|---|
| 0 | 00000100100000000 | 00000100010000000 | 01001000001001000 | 01001000001001000 |
| ≀ | ≀ | ≀ | ≀ | ≀ |
| 87 | 00000001001001000 | 01000100001000100 | 10001000010001000 | 01000100001000100 |

| MCG1 (CodeGroup 1) | | | | MCG2 (CodeGroup 2) | | | | DCG1 (CodeGroup 3) | | | | DCG2 (CodeGroup 4) | | | | DSV Group (CodeGroup 5) | |
|---|---|---|---|---|---|---|---|---|---|---|---|---|---|---|---|---|---|
| data | code (hex) | ncg | csv | inv | data | code (hex) | ncg | csv | inv | data | code (hex) | ncg | csv | inv | data | code (hex) | ncg | csv | inv | data | code (hex) |
| 225 | 4821 | 2 | 1 | 0 | 225 | 1088 | 3 | 3 | 1 | 225 | 4821 | 2 | 1 | 0 | 225 | 1088 | 3 | 3 | 1 | | |
| 226 | 4822 | 2 | 1 | 0 | 226 | 1088 | 4 | 3 | 1 | 226 | 4822 | 2 | 1 | 0 | 226 | 1088 | 4 | 3 | 1 | | |
| 227 | 4824 | 5 | 3 | 0 | 227 | 1090 | 3 | 5 | 1 | 227 | 4824 | 5 | 3 | 0 | 227 | 1090 | 3 | 5 | 1 | | |
| 228 | 4840 | 1 | 1 | 1 | 228 | 1224 | 4 | 1 | 0 | 228 | 4840 | 1 | 1 | 1 | 228 | 1224 | 4 | 1 | 0 | | |
| 229 | 4841 | 2 | 1 | 0 | 229 | 1090 | 3 | 3 | 1 | 229 | 4841 | 2 | 1 | 0 | 229 | 1090 | 3 | 3 | 1 | | |
| 230 | 4842 | 5 | 3 | 0 | 230 | 1108 | 4 | 1 | 1 | 230 | 4842 | 5 | 3 | 0 | 230 | 1108 | 4 | 1 | 1 | | |
| 231 | 4844 | 1 | 1 | 1 | 231 | 1108 | 3 | 3 | 0 | 231 | 4844 | 1 | 1 | 1 | 231 | 1108 | 3 | 3 | 0 | | |
| 232 | 4848 | 1 | 1 | 0 | 232 | 1110 | 4 | 1 | 0 | 232 | 4848 | 1 | 1 | 0 | 232 | 1110 | 4 | 1 | 0 | | |
| 233 | 4849 | 2 | 1 | 0 | 233 | 2484 | 4 | 1 | 0 | 233 | 1089 | 2 | 1 | 1 | 233 | 2484 | 4 | 1 | 0 | | |
| 234 | 4880 | 2 | 1 | 1 | 234 | 1224 | 2 | 1 | 1 | 234 | 4880 | 2 | 1 | 1 | 234 | 1224 | 4 | 1 | 1 | | |
| 235 | 4881 | 5 | 3 | 0 | 235 | 1110 | 4 | 3 | 0 | 235 | 4881 | 5 | 3 | 0 | 235 | 1110 | 4 | 3 | 0 | | |
| 236 | 4882 | 1 | 1 | 0 | 236 | 1120 | 3 | 5 | 0 | 236 | 4882 | 1 | 1 | 0 | 236 | 1120 | 3 | 5 | 0 | | |
| 237 | 4884 | 1 | 1 | 1 | 237 | 1244 | 4 | 1 | 1 | 237 | 4884 | 1 | 1 | 1 | 237 | 1244 | 4 | 1 | 1 | | |
| 238 | 4888 | 2 | 1 | 0 | 238 | 1210 | 3 | 1 | 0 | 238 | 4888 | 2 | 1 | 0 | 238 | 1210 | 3 | 1 | 0 | | |
| 239 | 4889 | 5 | 3 | 0 | 239 | 1244 | 4 | 3 | 0 | 239 | 4889 | 5 | 3 | 0 | 239 | 1244 | 4 | 3 | 0 | | |
| 240 | 4890 | 4 | 1 | 0 | 240 | 1120 | 4 | 1 | 0 | 240 | 4890 | 4 | 1 | 0 | 240 | 1120 | 4 | 1 | 0 | | |
| 241 | 4891 | 1 | 1 | 0 | 241 | 1091 | 2 | 1 | 1 | 241 | 1091 | 2 | 1 | 0 | 241 | 1091 | 2 | 1 | 1 | | |
| 242 | 4892 | 2 | 1 | 0 | 242 | 1244 | 4 | 3 | 1 | 242 | 4892 | 2 | 1 | 0 | 242 | 2488 | 4 | 1 | 1 | | |
| 243 | 4901 | 5 | 3 | 0 | 243 | 1220 | 4 | 1 | 0 | 243 | 4901 | 5 | 3 | 1 | 243 | 1244 | 4 | 3 | 1 | | |
| 244 | 4902 | 1 | 1 | 0 | 244 | 1240 | 3 | 1 | 1 | 244 | 4902 | 1 | 1 | 0 | 244 | 1220 | 4 | 1 | 0 | | |
| 245 | 4904 | 2 | 5 | 0 | 245 | 1248 | 4 | 3 | 1 | 245 | 4904 | 2 | 5 | 0 | 245 | 1240 | 3 | 1 | 1 | | |
| 246 | 4908 | 2 | 1 | 0 | 246 | 1210 | 4 | 5 | 0 | 246 | 4908 | 2 | 1 | 0 | 246 | 1248 | 4 | 3 | 1 | | |
| 247 | 4909 | 4 | 1 | 0 | 247 | 1092 | 2 | 1 | 0 | 247 | 4909 | 4 | 1 | 0 | 247 | 1092 | 2 | 5 | 0 | | |
| 248 | 4910 | 2 | 1 | 1 | 248 | 2488 | 5 | 3 | 0 | 248 | 4910 | 2 | 1 | 1 | 248 | 2488 | 5 | 3 | 0 | | |
| 249 | 4911 | 1 | 1 | 0 | 249 | 1122 | 2 | 1 | 0 | 249 | 1111 | 2 | 1 | 0 | 249 | 2490 | 4 | 1 | 0 | | |
| 250 | 4912 | 3 | 3 | 0 | 250 | 1240 | 2 | 1 | 0 | 250 | 1221 | 4 | 1 | 0 | 250 | 1122 | 4 | 1 | 0 | | |
| 251 | 4920 | 2 | 3 | 0 | 251 | 1122 | 5 | 3 | 0 | 251 | 4920 | 2 | 3 | 0 | 251 | 2490 | 5 | 3 | 0 | | |
| 252 | 4921 | 1 | 1 | 0 | 252 | 1221 | 2 | 1 | 0 | 252 | 1221 | 2 | 1 | 0 | 252 | 1122 | 3 | 1 | 0 | | |
| 253 | 4922 | 2 | 1 | 1 | 253 | 1241 | 2 | 1 | 1 | 253 | 1241 | 4 | 1 | 1 | 253 | 2492 | 4 | 3 | 0 | | |
| 254 | 4924 | 5 | 3 | 0 | 254 | 1242 | 5 | 3 | 0 | 254 | 1242 | 4 | 3 | 0 | 254 | 2492 | 4 | 5 | 0 | | |
| 255 | 4924 | 1 | 1 | 0 | 255 | 1242 | 5 | 1 | 0 | 255 | 4924 | 4 | 3 | 1 | 255 | 1242 | 5 | 1 | 0 | | |

| TYPE OF SYNC CODE | SYNCHRONIZATION CODEWORD |
|---|---|
| SYNC1 | x000x00100010000000000001000100 |
| SYNC2 | x00x001000010000000000001000100 |
| SYNC3 | x00001000001000000000001000100 |
| SYNC4 | x00010000001000000000001000100 |

FIG. 7

| ncg | CODE GROUP |
|---|---|
| 1 | MCG1 OR MCG2 |
| 2 | MCG2 |
| 3 | DCG1 |
| 4 | DCG2 |
| 5 | MCG2 OR DSV GROUP |

FIG. 6

| dt(i) | ncg(i-1) | code(i) (hex) | ncg(i) | INV(i) | CUMULATED INV(i) | CSV(i) | DSV(i) |
|---|---|---|---|---|---|---|---|
| 000 | 1 | 2001 | 2 | 0 | 0 | 11 | 011 |
| 132 | 2 | 0480 | 3 | 0 | 0 | 9 | 002 |
| 019 | 3 | 2041 | 2 | 1 | 1 | 1 | 003 |
| 007 | 2 | 0091 | 2 | 1 | 0 | -7 | 010 |
| 200 | 2 | 1112 | 5 | 0 | 0 | -1 | 009 |
| 017 | 5 | 2040 | 3 | 0 | 0 | -1 | 008 |
| 187 | 3 | 4400 | 1 | 0 | 0 | -7 | 001 |
| 015 | 1 | 2024 | 3 | 1 | 1 | 7 | 008 |
| 164 | 3 | 4120 | 4 | 1 | 0 | 9 | -01 |
| 150 | 4 | 0892 | 5 | 0 | 0 | -1 | -02 |
| 044 | 5 | 2108 | 3 | 1 | 1 | 3 | 001 |
| 222 | 3 | 4811 | 2 | 0 | 1 | -1 | 002 |
| 243 | 2 | 1248 | 3 | 0 | 1 | -3 | 005 |
| 095 | 3 | 4808 | 4 | 1 | 0 | -1 | 006 |
| 060 | 4 | 0404 | 3 | 0 | 0 | 1 | 007 |
| 080 | 3 | 4444 | 3 | 0 | 0 | 1 | 008 |
| 036 | 3 | 4102 | 5 | 1 | 1 | 1 | 009 |
| 097 | 5 | 2420 | 4 | 1 | 0 | 3 | 006 |
| 191 | 4 | 1080 | 4 | 0 | 0 | -5 | 001 |
| 215 | 4 | 1048 | 3 | 1 | 1 | 5 | 006 |
| 239 | 3 | 4889 | 2 | 1 | 0 | 1 | 005 |
| 209 | 2 | 1042 | 5 | 1 | 1 | 1 | 006 |
| 022 | 5 | 2044 | 4 | 1 | 0 | 5 | 001 |
| 161 | 4 | 0922 | 5 | 0 | 0 | -1 | 000 |
| 238 | 5 | 1210 | 3 | 1 | 1 | 1 | 001 |
| 117 | 3 | 4912 | 5 | 1 | 0 | 3 | -02 |
| 044 | 5 | 2108 | 3 | 1 | 1 | 3 | 001 |
| 203 | 3 | 1021 | 2 | 1 | 0 | 1 | 000 |
| 187 | 2 | 0920 | 4 | 1 | 1 | 3 | 003 |
| 104 | 4 | 2244 | 3 | 0 | 1 | 1 | 002 |
| 177 | 3 | 4220 | 4 | 1 | 0 | 7 | -05 |
| 195 | 4 | 2444 | 4 | 0 | 0 | -1 | -06 |
| 075 | 4 | 0210 | 4 | 0 | 0 | -5 | -11 |
| 041 | 4 | 0202 | 5 | 0 | 0 | 1 | -10 |

METHOD OF GENERATING RUN LENGTH LIMITED (RLL) CODE HAVING IMPROVED DC SUPPRESSION CAPABILITY AND MODULATION/DEMODULATION METHOD OF THE GENERATED RLL CODE

CROSS-REFERENCE TO RELATED APPLICATIONS

This application claims the benefit of Korean Application No. 99-7723, filed Mar. 9, 1999, in the Korean Patent Office, the disclosure of which is incorporated herein by reference.

BACKGROUND OF THE INVENTION

1. Field of the Invention

The present invention relates to modulation of a series of m-bit information words into a modulated signal and demodulation of the modulated signal, and more particularly, to a method of generating a run length limited (RLL) code which uses the less number of bits for a code word and efficiently suppresses the DC component of a code word stream, and a method of modulating/demodulating the RLL code for use in optical recording and/or reproducing devices requiring high density recording and/or reproducing.

2. Description of the Related Art

In optical recording and/or reproducing devices, a run length limited (RLL) code represented by (d, k, m, n) is widely used for modulating original information into a signal appropriate for an optical disk and demodulating the signal reproduced from the optical disk into the original information.

In the RLL code represented by (d, k, m, n), main conversion of data is carried out using the main conversion table of FIG. 1A. The code groups 1 and 4 in the main and sub conversion tables of FIGS. 1A and 1B are divided by the number of lead zeros (LZ), while the code groups 2 and 3 are also exclusively divided by referring to a predetermined bit of the code word and determining whether the bit is "0", or "1". That is, no code words in the code groups 1 and 4 are the same, and no code words in the code groups 2 and 3 are the same. The main and sub conversion tables of FIGS. 1A and 1B are suggested in U.S. Pat. No. 5,790,056, "Method of converting a series of m-bit information words to a modulated signal, method of producing a record carrier, coding device, device, recording device, signal, as well as a recorded carrier."

The RLL code uses a (d, k)-constraint method in which code words of a code group select a next code group in compliance with the (d, k) constraint. Using the sub conversion table of FIG. 1B, suppression of the DC component in a code word stream can be carried out when data less than or equal to 87 is input. The code words of the code groups in the sub conversion table are allocated by using code words not included in the main conversion table, each of the code words of the code groups in the sub conversion table having a code word sum value (CSV), a parameter representing the direct current (DC) value in a code word, which is opposite in sign to CSVs of corresponding code words having the same decoded value in the main conversion table, in order to suppress the DC component.

In the code groups 1 and 4 in the main conversion table and the sub conversion table of FIGS. 1A and 1B, a code group advantageous to suppression of the DC component can be selected if the (d, k) constraint of the run length is not violated. However, the code words are allocated without considering the CSV signs of code words which are included in the code groups 1 and 4 and the characteristics of an INV parameter, proposed by the present invention, which predicts the transition direction of a next code word by determining whether the number of "1"s in a code word is an odd number or an even number. Therefore, it is not appropriate to generate a code conversion table to convert an 8-bit information word into a 15-bit code word, separately from the conventional code (2, 10, 8, 16) of FIGS. 1A and 1B, which converts an 8-bit information word into a 16-bit code word.

In addition, for data less than or equal to 87, a code word can be selected from both the main conversion table and the sub conversion table in order that their CSV signs are opposite, so that the DC component can be suppressed. However, because the code words of the sub conversion table are newly allocated code words which are not included in the main conversion table, as much code words as the code words in the sub conversion table are additionally required after all, which imposes a limitation in reducing the number of bits of a code word.

Also, the code words in the sub conversion table are allocated to have opposite signs to those of corresponding code words having the same decoded value in the main conversion table, but the characteristics of INV which is a code word parameter proposed by the present invention are not considered for allocation, which causes a problem in that the possibility of DC suppression cannot be maximized when a modulated code with a smaller number of code words is used in DSV control which is carried out in a predetermined look-ahead method.

SUMMARY OF THE INVENTION

To solve the above problems, it is an object of the present invention to provide a method of generating an RLL code capable of efficient DC suppression of a code word stream, in which method code words having a smaller number of bits are delivered, by generating a main conversion table using the maximum CSV and INV which are the code word characteristic parameters of the main conversion table while using some of the code words already used in the main conversion table as code words for a sub conversion table for DC suppression.

It is another object to provide a modulation method of modulating the RLL code having an improved DC suppression capability.

It is still another object to provide a demodulation method of demodulating a modulated code word stream using the RLL code having an improved DC suppression capability.

Additional objects and advantages of the invention will be set forth in part in the description which follows and, in part, will be obvious from the description, or may be learned by practice of the invention.

To accomplish the above object and other objects of the present invention, there is provided a method of generating a run length limited (RLL) code which is represented by (d, k, m, n), in which d, k, m, and n denote the minimum run length, the maximum run length, the length of data bits, and the length of code word bits, respectively, the method comprising (a) generating a code word which satisfies the (d, k) run length constraint; and (b) allocating main code groups, in which a code word can be duplicated and allocated in a main code group depending on the characteristics of the generated code word, and code words of each main code group are allocated in consideration of a code word sum value (CSV) parameter, which represents the direct current (DC) value in a code word, and the characteristic of an INV parameter, which predicts the transition direction of a digital sum value (DSV) of a next code word, and allocating decision code groups for differentiating duplicated code words.

To accomplish another object and other objects of the present invention, there is provided a method of modulating data input to optical disc recording and/or reproducing devices into a run length limited (RLL) code which is represented by (d, k, m, n), in which d, k, m, and n denote the minium run length, the maximum run length, the length of data bits, and the length of code word bits, respectively, the modulating method comprising (a) modulating m-bit input data into a code word after selecting the code word in a code group among main code groups in which a code word can be duplicated and code words of each main code group are allocated in consideration of code word sum value (CSV) parameter which represents the direct current (DC) value in a code word and the characteristic of an INV parameter which predicts the transition direction of a digital sum value (DSV) of a next code word, and decision code groups for differentiating the duplicated code words.

To accomplish still another object and other objects of the present invention, there is provided a method of demodulating a run length limited (RLL) code into original data, the RLL code which is represented by (d, k, m, n) in which d, k, m, and n denote the minium run length, the maximum run length, the length of data bits, and the length of code word bits, respectively, in which the RLL code of a code word is modulated from m-bit input data after selecting the code word in a code group among main code groups in which a code word can be duplicated and code words of each main code group are allocated in considering of a code word sum value (CSV) parameter which represents the direct current (DC) value in a code word and the characteristic of an INV parameter which predicts the transition direction of digital sum value (DSV) of the next code word, and decision code groups for differentiating the duplicated code words, the demodulating method of optical disc recording and/or reproducing devices comprising (a) inputting a code word stream, and updating a parameter ncg, which indicates a group to which a code word to be demodulated belongs, according to the characteristics of a preceding code word; (b) demodulating the code word to be demodulated in the code group pointed out by the updated ncg into the original m-bit data if two duplicated current code words do not exist in the code group pointed out by the updated ncg.

BRIEF DESCRIPTION OF THE DRAWINGS

The above objects and advantages of the present invention will become more apparent by describing in detail preferred embodiments thereof with reference to the attached drawings in which:

FIGS. 1A and 1B are examples of existing modulation/demodulation conversion tables;

Figure 3A:
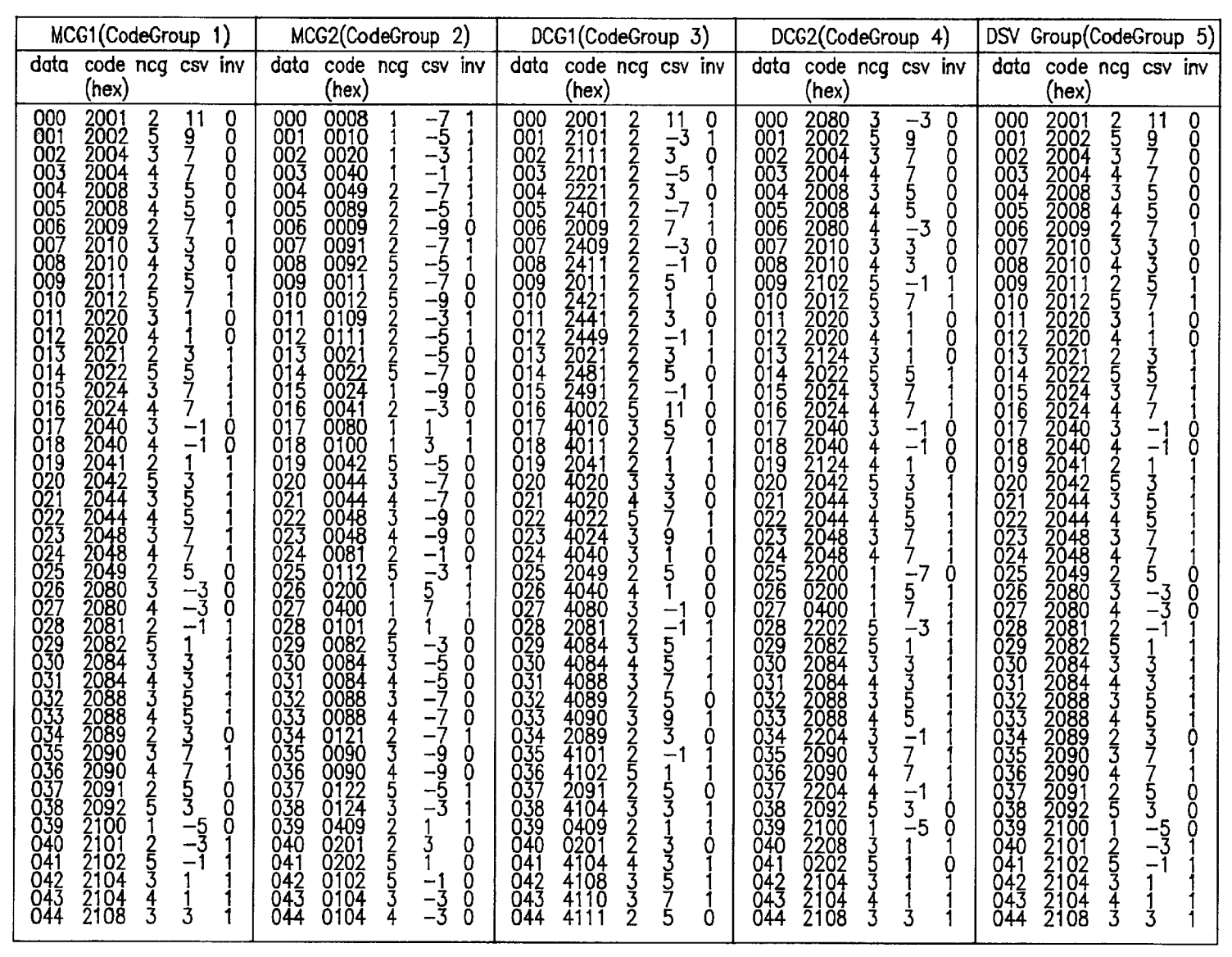
Figure 3B:
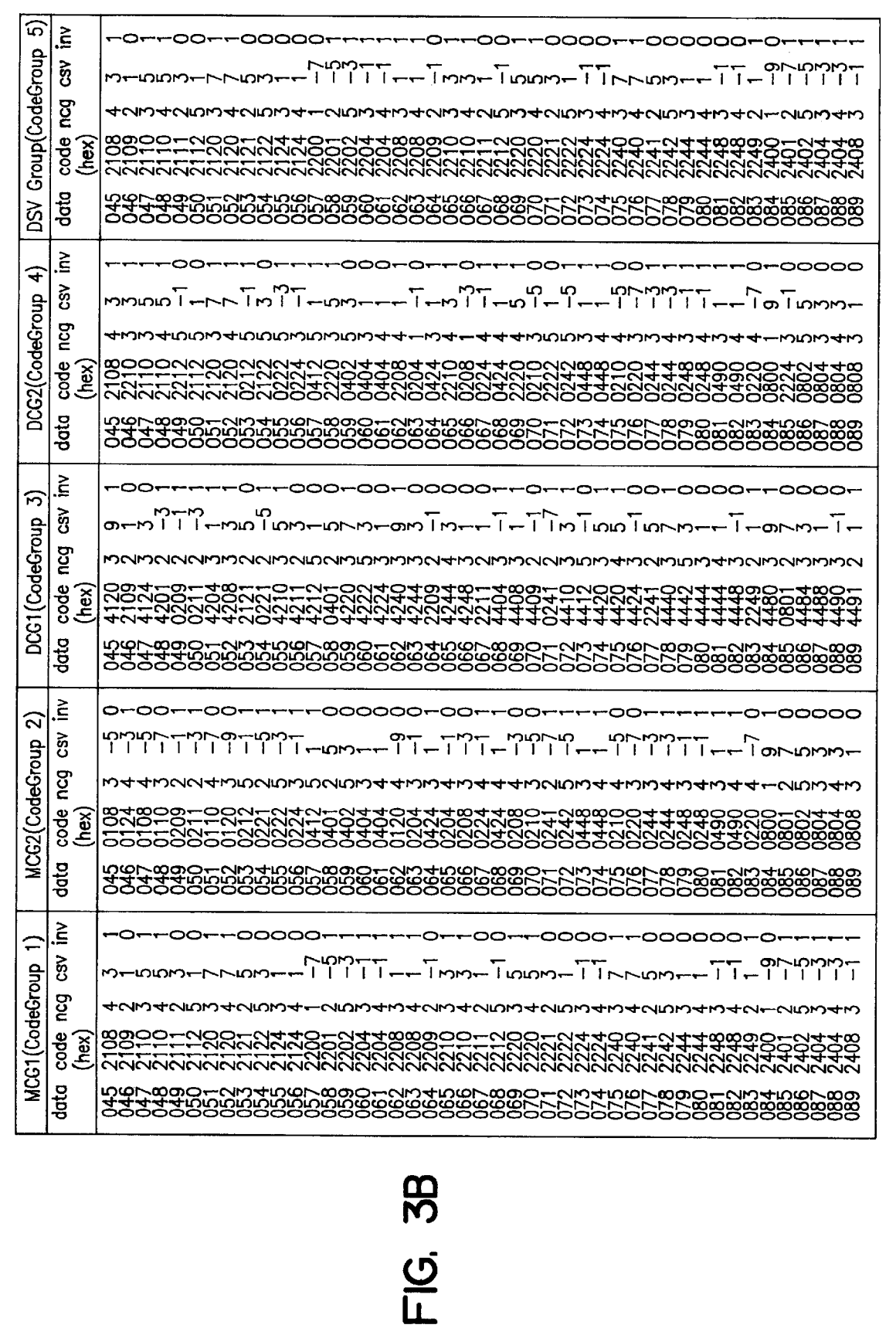
Figure 3C:
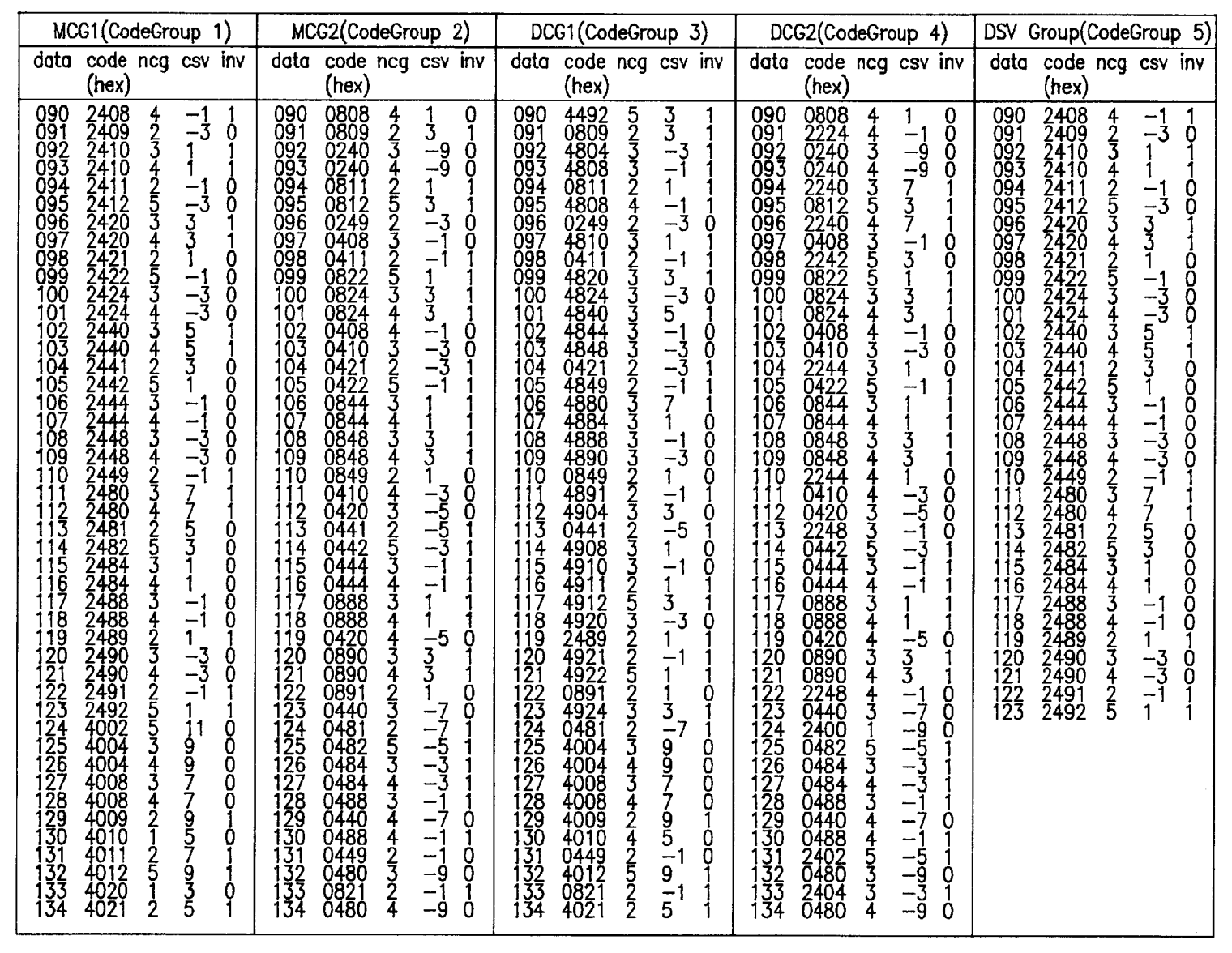
Figure 3D:
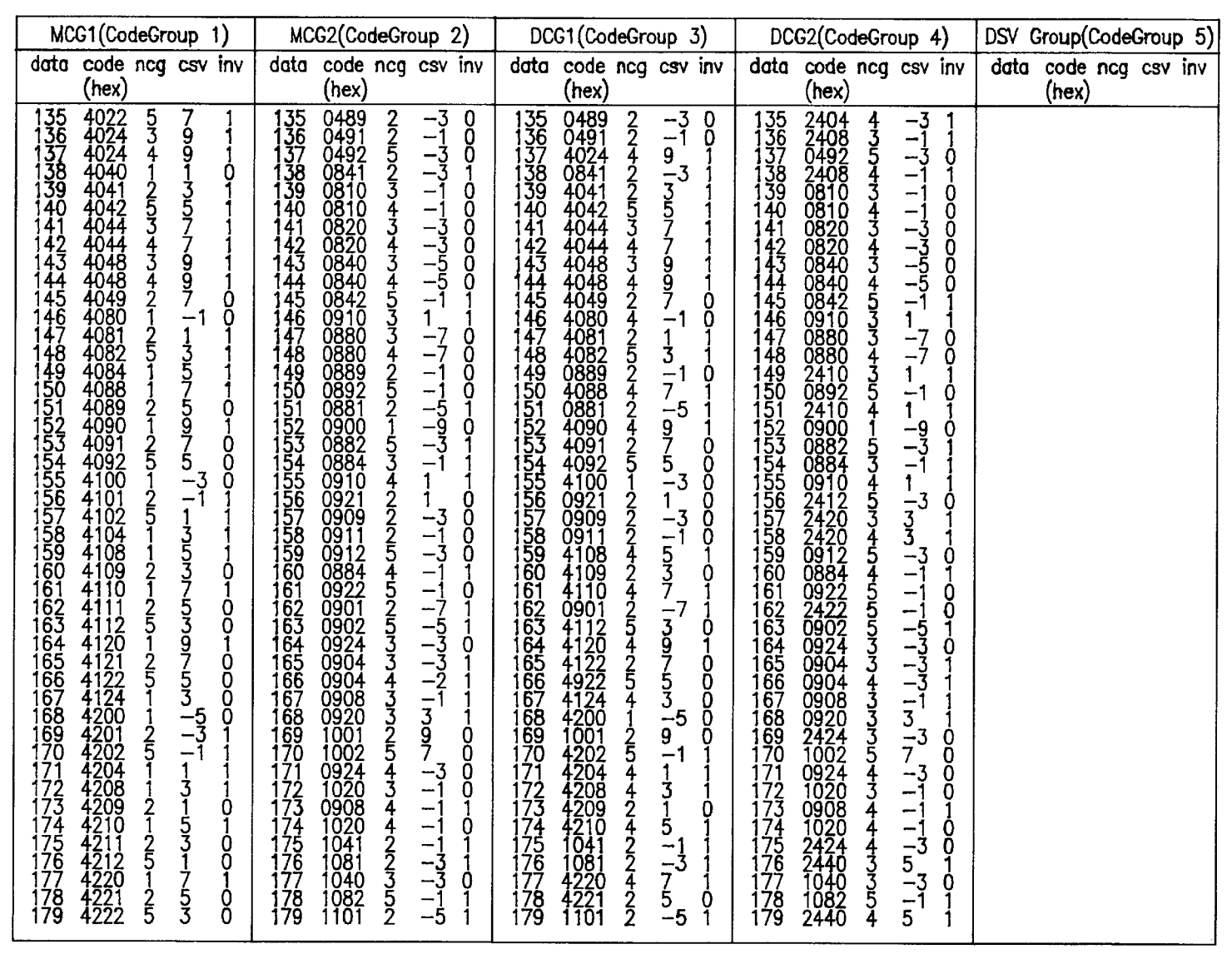
Figure 3E:
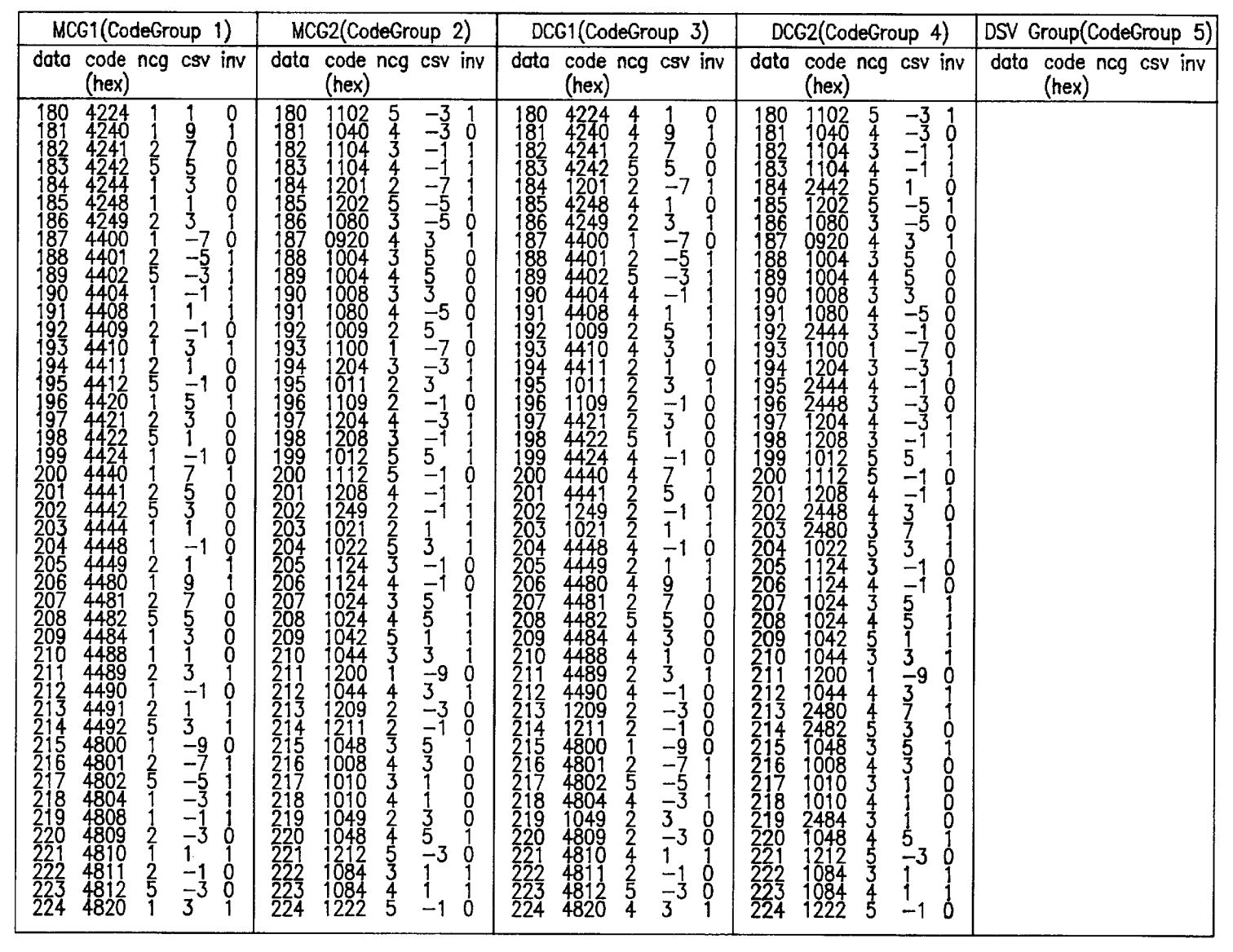

FIGS. 3A through 3F are tables showing conversion code, a next code group (ncg), and characteristics (INV, CSV) of a code word for modulation and demodulation of a (2, 12, 8, 15) code generated by the method shown in FIG. 2;

FIG. 5 is a table showing the types of synchronization code which can be used in the (2, 12, 8, 15) code according to the present invention;

FIG. 6 is a table showing a modulation process using the conversion tables shown in the tables of FIGS. 3A through 3F;

FIG. 7 is a table of code groups pointed out by the ncg used in the present invention;

DETAILED DESCRIPTION OF THE INVENTION

Figure 2:
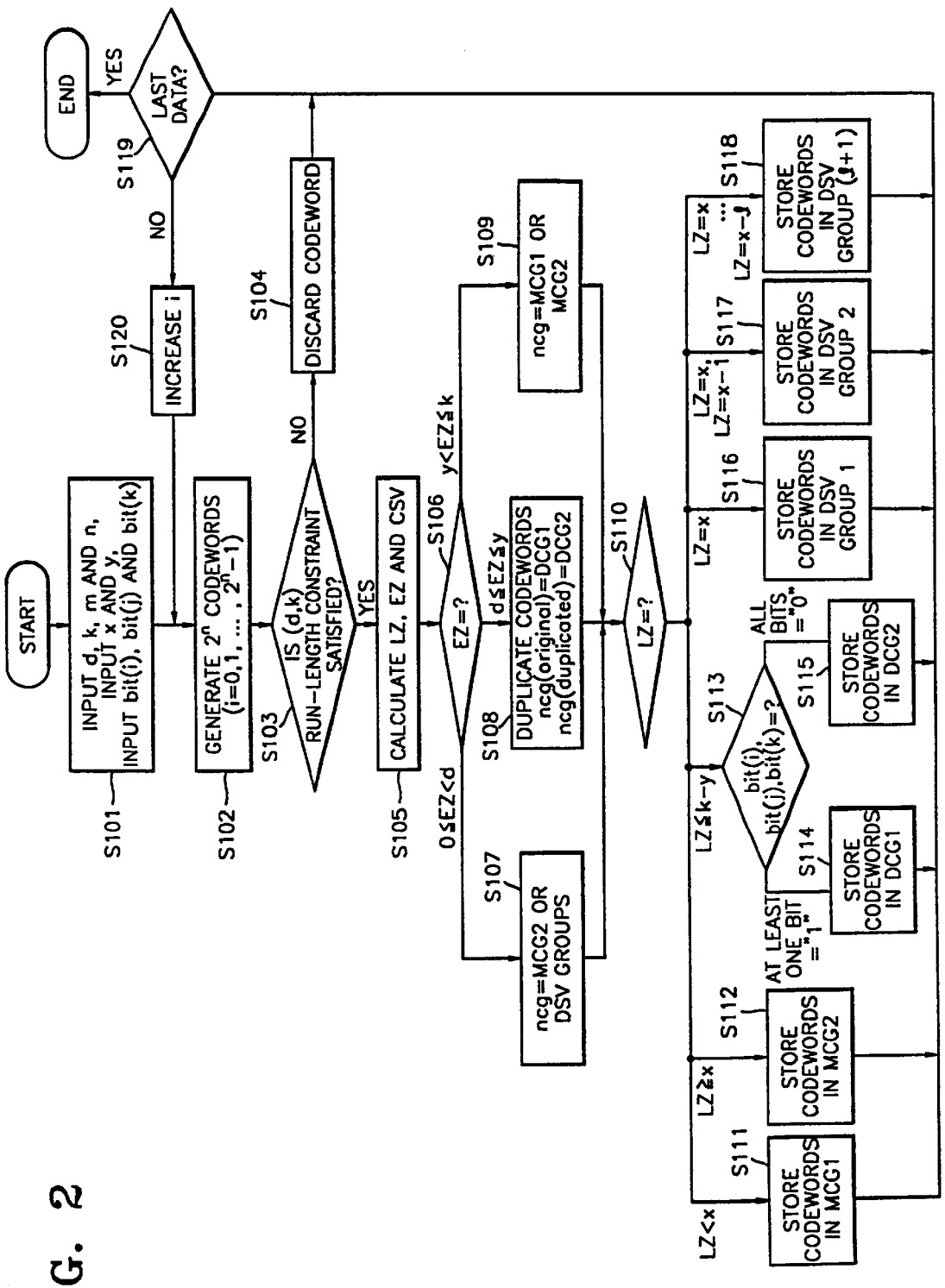
FIG. 2 is a flowchart showing an embodiment of a method of generating code groups for a run length limited (RLL) code expressed by (d, k, m, n) proposed by the present invention.

Reference will now made in detail to the present preferred embodiments of the present invention, examples of which are illustrated in the accompanying drawings, wherein like reference numerals refer to the like elements throughout. The embodiments are described below in order to explain the present invention by referring to the figures.

Among factors indicating code performance in the run length limited (RLL) code, which is represented by (d, k, m, n), recording density and suppression capability of a code are generally used in evaluating superiority of a code. The recording density and detection window margin of a code are expressed as the following equations 1 and 2.

$$\text{recording density} = (d+1)\, m/n \qquad (1)$$

$$\text{detection window margin} = (m/n)T \qquad (2)$$

Here, m is the number of data bits (also called the number of source bits, or the number of information word bits), n is the number of code word bits after modulation (also called the number of channel bits), d is the minimum number of consecutive zeros which can exist between the "1" bits in a code word, k is the maximum number of consecutive zeros which can exist between the "1" bits in a code word, and T is an interval between each bit in a code word.

As shown in the equation 1, a way for enhancing recording density in a modulation method is to reduce n, the number of code word bits, while maintaining the same d and m. However, the RLL code must satisfy the constraint that d is the minimum number of consecutive zeros situated between the "1" bits in a code word, and the constraint that k is the maximum number of consecutive zeros situated between the "1" bits in a code word. If the number of data bits that satisfy the (d, k) constraint is m, the number of code words that satisfy the RLL(d, k) constraint must be $2^m$ or more. However, in order to actually use such codes, even a part which connects a code word to another code word must satisfy the RLL(d, k) constraint, and the code to be used must have DC suppression capability when the code is used in optical disc recording and/or reproducing devices in which the DC component of a code affects system performance.

For this reason, as for a compact disc (CD), an eight-to-fourteen modulation (EFM) code, wherein 8-bit data is modulated into a 14-bit code word, requires an additional 3 merge bits between code words in addition to the 14-bit converted code word in order to have DC suppression capability while satisfying a run length constraint of the RLL(2, 10) (CD uses a code of 'd=2' and 'k=10'). The merge bits are added only for run length (d, k) and DC suppression without including any information, and become a heavy burden in enhancing recording density.

As for a digital versatile disc (DVD), an EFM plus (EFM+) code is used. The EFM+ code also has a run length constraint of the RLL(2, 10), but does not use merge bits. Instead, the length (n) of a code word is 16 bits. In this case, the number of code words which can be used is 566 in total, and as shown in FIGS. 1A and 1B, the EFM+ code has four main conversion tables and four sub conversion tables. If the run length (2, 10) is satisfied by using the four main conversion tables, DC suppression of a code stream is carried out by using the sub conversion tables.

The above described code is superior in the aspect of the DC suppression of the DC component. In particular, the EFM+ code which is applied to a DVD reduces the number of code word bits by one bit, and achieves a 5.9% increase in recording density by only changing a code modulation method, compared to the EFM code which is applied to a CD. However, even the EFM+ code also requires four additional sub conversion tables, which causes a problem in that it is difficult to reduce the number of code word bits.

Therefore, though using separate sub conversion tables for DC suppression as conventional methods do, an embodiment of the present invention uses some of the code words already used in the main conversion tables as code words for the sub conversion tables, and utilizes to the maximum the code word characteristics of the main conversion tables, that is, the CSV, which is a parameter for indicating the DC value of a code word, and the INV, which is a parameter for predicting a DSV transition direction, to make a main conversion table, thus reducing the number of code word bits. An RLL code generating method which increases DC suppression capability and recording density by using these main and sub conversion tables and is particularly appropriate for a high-density optical disc system will now be described.

First, terms used in the present invention will be described.

| (Preceding code) | | (Current code) | |
|---|---|---|---|
| 000010001001000 | | 001000001001000 | |
| LZ(p) | EZ(p) | LZ(c) | EZ(c) |

Here, the minimum run length is d, the maximum run length is k, the length of data bits is m, and the length of code word bits is n. LZ(p) and LZ(c) are the number of lead zeros in a previous code word and in a current code word, respectively, while EZ(p) and EZ(c) are the number of end zeros in a previous code word and in a current code word, respectively. DSV is a digital sum value in a code word stream, that is, a value made by counting "0" bits as "−1", and "1" bits as "+1" in the inverted pattern after inverting "0" or "1" until the next "1" comes whenever "1" comes in a code word stream. CSV is a digital sum value in a code word, that is, a value made by counting 0 as "−1", and 1 as "+1" in the inverted pattern after inverting "0" or "1" until the next "1" comes whenever "1" comes in a code word. INV is a parameter which predicts the transition of a next code word. If there is an even number of "1"s in a code word, the INV parameter value is 0 (INV=0), and, if the number of "1"s in a code word is an odd number, the INV parameter value is 1 (INV=1). 'x' is a parameter which divides the main code groups, 'y' is a duplication parameter, and bit(i), bit(j), and bit(k) represent ith, jth, and kth bits, respectively, in a code word. Here, if the INV value cumulated in a code word stream is 0, the DSV value is updated by adding the CSV value of the next code, without change, to the DSV value cumulated previously, and, if the INV value is "1," the DSV value is updated by adding the CSV value of the next code to the DSV value cumulated previously after inverting the sign of the CSV.

If the above code stream is taken as an example, INV, CSV, and DSV parameters are given as follows.

```
Code word: 000010001001000        001001001001000
INV:                   1                         0
CSV:                  +1                        −3
code stream: 000011110001111      110001110001111
DSV: −1−2−3−4−3−2−1 0−1−2−3−1 0+1  +2++3+2+1 0+1+2+3+2+1 0+1+2+3+4
```

In FIG. 2, which is a flowchart showing an embodiment of a method of generating RLL codes according to the present invention, the minimum run length (d), the maximum run length (k), the data bit length (m), the code word bit length (n), the division parameter (x) of the main code groups, the code word duplication parameter (y), and predetermined bits (bit (i), bit (j), bit (k)) are input as desired in step S101.

$2^n$ code words from 0 through $2^{n-1}$ that satisfy the constraints input in the step S101 are generated in step S102. It is determined whether the generated codes satisfy the run length (d, k) constraint in step S103. Since only those codes that satisfy the run length (d, k) constraint can be used among the generated codes, the code words that do not satisfy the run length (d, k) constraint are discarded in step S104. The characteristics of code words are extracted from the code words that satisfy the run length (d, k) constraint in step S105, and parameters for extracting required characteristics include the number of lead zeros (LZ), the number of end zeros (EZ), and the code word sum value (CSV) of each code word.

Some code words are duplicated in order to increase the number of available codes, and the EZ values are checked in order to satisfy the (d, k) constraint of connection parts between code words in step 106. According to the EZ values, the following operations are performed.

If the number of end zeros (EZ) in a code word is $0 \leq EZ < d$, the code words of the next code group (hereinafter referred as ncg) are selected in order that the next code word is selected from the $2^{nd}$ Main Code Group (MCG2) or the DSV group, in step S107.

If the number of end zeros (EZ) in a code word is $d \leq EZ \leq y$, the code word is duplicated, and the ncg is selected in order that the next code words can be selected from the $1^{st}$ Decision Code Group (DCG1) or the $2^{nd}$ Decision Code Group (DCG2), in step S108. At this time, for the code words which are not duplicated, the ncg is selected in order that the next code words is selected from the $1^{st}$ Decision Code Group (DCG1), and, for the code words which are duplicated, the ncg is selected in order that the next code word is selected from the $2^{nd}$ Decision Code Group (DCG2).

If the number of end zeros (EZ) in a code word is y<EZ≦k, the ncg is selected in order that the next code words are selected from the MCG1 or the MCG2 in step S109.

In this manner, the ncg of code words that satisfy the (d, k) constraint is selected. According to the ncg, a code group of a next code word that can be attached to the current code word is determined, and the connection part of code words also satisfies the (d, k) constraint. Here, the reason why the codes that satisfy d≦EZ≦y are duplicated is that, for the codes of which EZ values are 0, 1, . . . , d−1, DSV control of the code word stream is performed by using DSV groups in order to suppress the entire DC component.

A method of grouping code words by code group and the characteristics of each code group will now be described. In order to group code words by code group, the number of lead zeros, that is an LZ value, is used, and the LZ value of a code word is checked in step 110.

If the LZ value of a code word is less than x, the code word is stored in order of code word value in the MCG1 in step 111. If the LZ value is LZ≧x, the code word is stored in the MCG2 so that a code word, which has signs of INV and CSV values opposite to those of an MCG1 code word that has the same decoded value, is allocated in step S112. If there is no code word of which both INV and CSV have opposite signs, then a code word which has the opposite CSV sign is allocated and next a code word which has the opposite INV value is allocated. The reason for allocating code words in this way is to enable selection of a code word that has a better capability for suppressing the DC component if both code words, which have the same decoded value, of the two code groups satisfy the (d, k) constraint when the ncg of a code word commands the calling of a next code word in the MCG1 or the MCG2. At the same time, it is because the code words which are included in the two code groups and correspond to the same decoded value have the opposite INV and CSV values, which makes DC control to be performed optimally in one of the two code words.

If the LZ value is LZ≦k−y, bit(i), bito), and bit(k) are checked in step S113. If one of the bits is "1", the code word is stored in the DCG1 in step S114. If the bits checked in the step S113 are all "0", the code word is stored in the DCG2 in step S115. The allocation of code words in the DCGs is carried out in order that as many code words as possible may have the same positions in the MCG1 and the MCG2. For example, if "100010001000100" is a code word in the MCG1 and included in the DCG1, and the code word has a decoded value of 128 in the MCG1, the code word is allocated in the position, in the DCG1, at which the decoded value corresponds to 128. This is to minimize error propagation when an error occurs in decoding.

The reason for allocating code words which satisfy LZ≦k−y to the DCGs is because the code words which satisfy d≦EZ≦y are duplicated. When duplicated code words are decoded, the next code word is referred to in order to correctly decode duplicated code words into corresponding data. If the next code word is selected from the DCG1, the current code word is demodulated into the decoded data corresponding to the original code word, and if the next code word is selected from the DCG2, the current code word is demodulated into the decoded data corresponding to the duplicated code word.

In addition, in order that the code words that satisfy d≦EZ≦y may be connected with code words of the DCG1 or the DCG2 while satisfying the (d, k) constraint, EZ(p)+LZ(c), the sum of the number of end zeros of the preceding code word, EZ(p), and the number of lead zeros of the current code word, LZ(c), must satisfy d≦EZ(p)+LZ(c)≦k, and therefore LZ(c) of the decision group must satisfy LZ≦k−y.

For example, upon decoding, when two duplicated "100010001000100" code words exist in the MCG1, that is, when the decoded value of the original code word "100010001000100" is 128 and the ncg is the DCG1, and the decoded value of the duplicated code word "100010001000100" is 129 and the ncg is the DCG2, the code word "100010001000100" is demodulated into 128 or 129 depending on whether the ncg is the DCG1 or the DCG2.

The allocation of DSV groups will now be described. The DSV groups are proposed in the present invention as a method of suppressing DC component in a code word stream, and correspond to sub-code groups because the DSV groups use code words already being used in the MCG1 and do not require additional code words.

The code words which satisfy LZ=x are allocated in DSV group 1 in step S116. The code words which satisfy LZ=x, or x−1 are allocated in DSV group 2 in step S117. In the same manner, the code words which satisfy LZ=x, or x−1, . . . , or x−1 are allocated in DSV group 1+1 in step S118. The allocation of code words in DSV groups are carried out as in the MCG1. That is, if identical code words are in the MCG1 and a DSV group, the code word of the DSV group is placed at the same position in the DSV group as the identical code word is positioned in the MCG1, and by doing so, the identical code words in the two code groups can be decoded into the same decoded value.

As described in the step S107, when the EZ value of a code word satisfies 0≦EZ≦d, the ncg is selected as the MCG2 or the DSV groups. Since the code words in the DSV group are extracted from the MCG1, the code words in the DSV groups are clearly distinguished from the code words in the MCG2. A code word which follows the code word that satisfies 0≦EZ<d is selected from one of the MCG2 and the DSV group, which has better capability for suppressing DC component.

Therefore, the method of selecting the DSV group is carried out in order that, if d≦EZ(p)+LZ(c)≦k is satisfied and EZ(p) is 0, a code word in DSV group 1 which satisfies LZ (c)=x is selected, if EZ(p) is 1, a code word in DSV group 2 is selected, and in the same manner, if EZ(p) is x, x−1, . . . , or x−1, a code word in DSV group 1+1 which satisfies LZ(c)=x, or x−1, . . . , or x−1 is selected.

The selected code word is stored in the corresponding code group. After determining whether or not data is the last data in step S119, if it is the last data, the process is concluded, and, otherwise, i (here, i=0, 1, . . . , $2^{n-1}$) is incremented in step S120, and the step S102 in which $2^n$ code words are generated is carried out.

FIGS. 3A through 3F are code conversion tables of code groups for the RLL code represented by (2, 12, 8, 15) generated by the algorithm of FIG. 2, and illustrates an example of a code table generation by setting parameters as d=2, k=12, m=8, n=15, x=2, y=2, bit(i)=14 (meaning the most significant bit (MSB)), and bit(j)=0 (meaning the least significant bit (LSB)), and by neglecting bit(k).

In the code conversion tables of FIGS. 3A through 3F, codes that satisfy 2≦EZ≦7 are duplicated, and code words included in the DSV group satisfy LZ=1 and represent patterns that do not exist in the MCG2. The code words in the MCG1 satisfy LZ <2, the code words in the MCG2 satisfy LZ≧2, each of the code words in the DCG1 satisfies that at least one of the MSB (bit 14) and the LSB (bit 0) is "1", and each of the code words in the DCG2 satisfies that both the MSB (bit 14) and the LSB (bit 0) are "0". If possible, code words are allocated in the same decoding position in the MCG1 and the MCG2 in order that the same decoded data may be generated. In addition, in order that the run length (d, k) constraint is not violated in modulation, each of the code words of the DCG1 and DCG2 must satisfy LZ≦5. The allocation of code words in the MCG1 and the DSV group are carried out in order that the code words have the opposite CSV signs and the opposite characteristics of INV compared to the code words in the MCG2.

To be brief, the present invention does not use separate code words for suppressing the DC component in addition to the main code group code words, and therefore does not require a large number of code words, and can reduce in the number of code word bits by one bit. When the preceding code word satisfies 0≦EZ(p)≦d, both the DSV group and the MCG2 can be selected within the limit in which d≦EZ(p)+LZ(c)≦k is satisfied, which increases DC suppression capability. In addition, the code words in the DSV group are allocated in order that they have the opposite CSV signs and INV characteristics compared to the code words of the MCG2, which also increases DC suppression efficiency.

As for the (2, 12, 8, 15) code described above as an embodiment of the present invention, if EZ(p)=1, the next code word can be selected from the DSV group and the MCG2. By forming the DSV group with the code words, in the MCG1, that satisfy LZ=1, and by locating the code words in the DSV group in order that the DSV code words have the same decoded value as the corresponding code words of the MCG1, error propagation in decoding can be prevented. Also, in order to increase DSV control capability, the code words can be allocated based on the CSV and INV parameters and may not have the same code words as the MCG1. In addition, by allocating the code words of the MCG1 and the MCG2 in order that they have the opposite CSV sign and INV characteristic, DC suppression can be performed in the code words which are not duplicated and satisfy d≦EZ(p)≦y, or within the limit in which the code words that satisfy EZ(p)>y satisfy d≦EZ(p)+LZ(c)≦k.

The modulation and demodulation method of the (2, 12, 8, 15) code having code conversion tables by the code groups shown in FIGS. 3A through 3F generated by the method of FIG. 2 will now be described.

Figure 4:
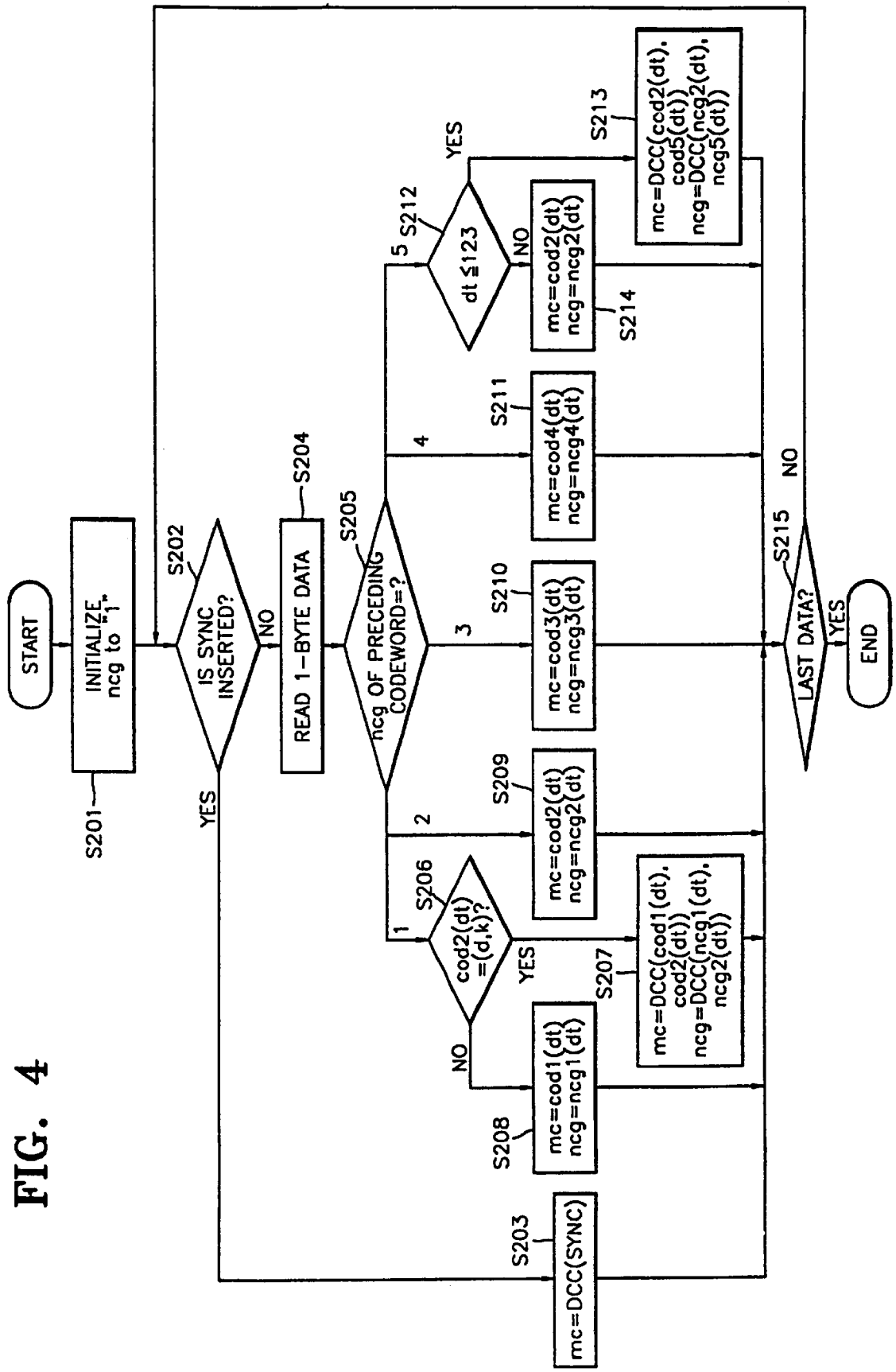
FIG. 4 is a flowchart showing an embodiment of a (2, 12, 8, 15) code modulation method using the conversion code shown in the tables of FIGS. 3A through 3F.

FIG. 4 illustrates a flowchart according to an embodiment of the method of modulating the RLL code represented by (2, 12, 8, 15) according to the present invention. The ncg is initialized to "1" in step S201, and whether to insert a synchronization code is determined in step S202. Examples of synchronization codes are shown in FIG. 5.

In the present invention, four types of synchronization code are presented as illustrated in FIG. 5. 'x' (meaning don't care bit) of the MSB of each synchronization code word is for preventing violation of the (d, k) run length constraint when connected to the EZ of the preceding code word, and can be one of "0" and "1". The second x in the code words of SYNC1 and SYNC2 is for suppressing the DC component, and can be selected advantageously in suppressing the DC component of a code word stream. Desirably, SYNC1 and SYNC2, which have the second x, can be used for frequently used synchronization, and SYNC3 and SYNC4, which do not have the second x, can be used for infrequently used synchronization, for example, synchronization for error correction of data that has a long delay such as interleaved data. Frequently used synchronization includes, for example, synchronization for controlling a spindle motor, or synchronization for error correction of data that are not interleaved.

A rule that a code word succeeding the synchronization code must be selected from a predetermined code word group is required. Therefore, in an embodiment of the present invention, the ncg is initialized to "1", and the code word for the succeeding data is selected in the MCG1.

If the result of the determination in step S202 indicates a time for inserting a synchronization code, the general synchronization inserting routine that selects a synchronization pattern advantageous in suppressing the DC component is performed in step S203, and, if data to be read is not the last of the data, the synchronization inserting determination in the step S202 is returned to again in step 215. In FIG. 4, mc represents a modulated code word, and DCC means to select what is advantageous for suppressing the DC component.

If the result of the determination in the step S202 does not indicate a time for inserting a synchronization code, input data is read in units of one byte in step S204, and a modulation code word is found for 1-byte data read from the corresponding code group according to the ncg pointed out by the preceding code word in step S205. But, when ncg=1 and ncg=5, two conversion code groups can be referred to for suppressing the DC component.

First, if the ncg of the preceding code word is 1, a modulated code word can be selected from code words of the MCG1 and the MCG2, the code words which satisfy 2≦EZ≦7 and are not duplicated, or which satisfy EZ>7 and obey the (2, 12) run length constraint, in steps 206 and 207. At this time, selection of a code group is performed based on whether the code group includes code words advantageous in suppressing the DC component. Therefore, in the step 207, a modulated code word (mc) advantageous in suppressing the DC component is selected from either the MCG1 or the MCG2, and the ncg is updated with an ncg pointed out by the code word included in the selected code group.

In FIG. 4, cod1(dt) represents that a code word to be modulated from input data in the MCG1 is selected, cod2(dt) represents that a code word to be modulated from input data in the MCG2 is selected, cod3(dt) represents that a code word to be modulated from input data in the DCG1 is selected, cod4(dt) represents that a code word to be modulated from input data in the DCG2 is selected, and cod5(dt) represents that a code word to be modulated from input data in the DSV code group is selected.

In the meantime, if the ncg of the preceding code word is "1" and the MCG2 does not satisfy the (2, 12) run length constraint, a modulated code word is selected from the MCG1 and the ncg is updated with an ncg pointed out by the selected code word in step S208.

If the ncg of the preceding code word is 2, the preceding code word satisfies EZ=0, and, at this time, the succeeding code word is selected without constraint from the MCG2, and the ncg is updated with an ncg pointed out by the selected code word in step S209. If the ncg of the preceding code word is 3 or 4, the preceding code word satisfies 2≦EZ≦7 and there are duplicated code words. Also the succeeding code word is selected from the DCG1 or the DCG2, respectively, and the ncg is updated with an ncg pointed out by the selected code word in steps S210 and S211, respectively.

If the ncg of the preceding code word is 5, the preceding code word satisfies EZ=1, and a modulated code word can be selected from the MCG2 or the DSV group if the data is less than or equal to 123, and the ncg is updated with an ncg pointed out by the selected code word in steps S212 and S213. At this time, the selection is performed based on whether the code group includes code words advantageous in suppressing the DC component. In the meantime, a modulated code word is selected from the MCG2 if the data is larger than 123, and the ncg is updated with an ncg pointed out by the selected code word in step S214.

In this manner, if the ncg is 1 or 5, the DC component can be suppressed, and the possibility of DC component suppression is about 10%. When the DC component can be suppressed, in order to suppress the DC component to the maximum, each of the code words of the selected two code groups is allocated so that its CSV sign and INV characteristic are opposite to those of a corresponding code word.

FIG. 6 is a table showing a part of the modulation process according to the modulation method of FIG. 4. dt(i) is input data to be modulated, and ncg(i−1) indicates a code group (the next code group of the preceding code word) to which the code word of the data to be modulated belongs. Here, code groups pointed out by the ncg are shown in FIG. 7. If the ncg is 1, the code group which includes the next code word of a current modulated code word is the MCG1 or the MCG2; if the ncg is 2, the code group which includes the next code word of a current modulated code word is the MCG2; if the ncg is 3, the code group which includes the next code word of a current modulated code word is the DCG1; if the ncg is 4, the code group which includes the next code word of a current modulated code word is the DCG2; and, if the ncg is 5, the code group which includes the next code word of a current modulated code word is the MCG2 or the DSV group.

In the meantime, code(i) of FIG. 6 represents a code word corresponding to dt(i) selected in the code group pointed out by ncg(i−1), and is presented in hexadecimal form. ncg(i) indicates a code group which includes a succeeding code word. INV(i) indicates whether the number of "1" bits in a code word is an odd number (INV(i)=1) or an even number (INV(i)=0), and a cumulated value CUMULATED INV(i) indicates the number of cumulated "1" bits in a code word stream, CSV(i) is a DC value in a code word, and DSV(i) is a cumulated DC value in a code word stream.

For example, the ncg of a code word preceding the code word of data dt(0) that is first input is 1, and the code word corresponding to data 0 is "2001h" in the MCG1 of FIG. 3. The ncg of the succeeding code word pointed out by "2001h" is 2, and therefore "0480h" in the MCG2 is selected as the code word corresponding to 132 of the second data dt(1). The ncg of 17(=dt(5)), the data which is input sixth, is 5, and since the number is less than 123, a code word can be selected from the MCG2 or the DSV group. There are "0080h" in the MCG2 and "2040h" in the DSV group. The CUMULATED INV and DSV of the previous code word (=dt(4)) are 0(=INV(4)) and 9(=DSV(4)), respectively. Since the CSV of "0080h" is 1, the DSV(5) is 10(=DSV(4)+1) and since the CSV of "2040h" is −1, the DSV(5) is 8(=DSV(4)−1). Therefore, "2040h", which is nearer to 0, is selected.

Therefore, as shown FIG. 6, the modulation is carried out in the manner in which the cumulated DSV value of a code word stream nearest to 0 is selected for modulation. Besides this method, the selection method based on the DSV can be varied as a designer wants.

Figure 8:
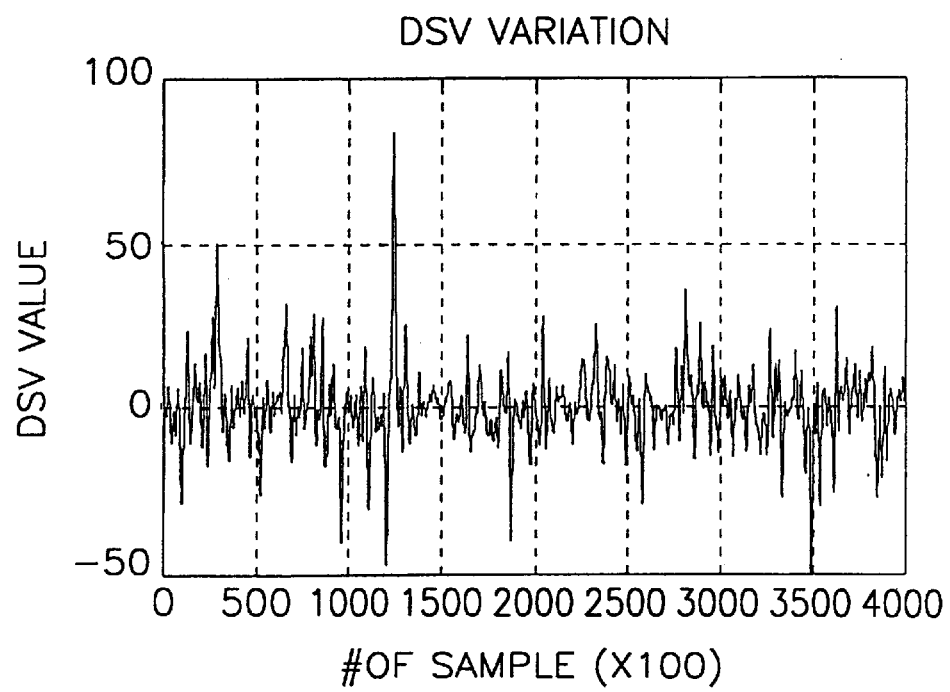
FIG. 8 is a curve showing a digital sum value (DSV) variation of the (2, 12, 8, 15) code according to an embodiment of the present invention.
Figure 9:
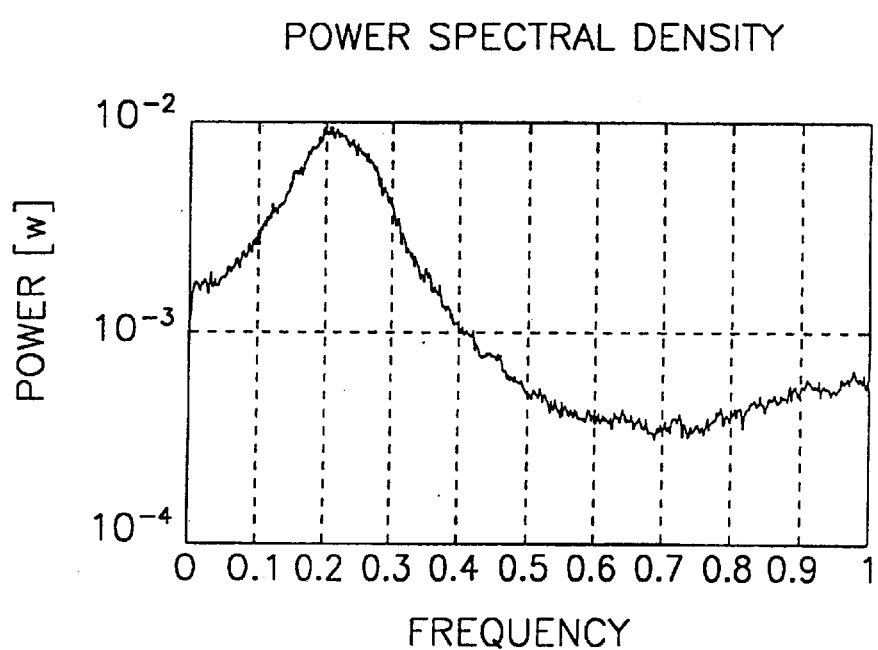
FIG. 9 illustrates the frequency spectrum of the (2, 12, 8, 15) code according to an embodiment of the present invention.

FIG. 8 is a curve showing DSV variation of the (2, 12, 8, 15) code according to an embodiment of the present invention. FIG. 8 shows that the DSV continues hovering on the line of "0," which proves the DC suppression capability of the code proposed by the present invention. FIG. 9 illustrates the frequency spectrum of the (2, 12, 8, 15) code according to an embodiment of the present invention, and proves that low frequency components are suppressed.

Figure 10:
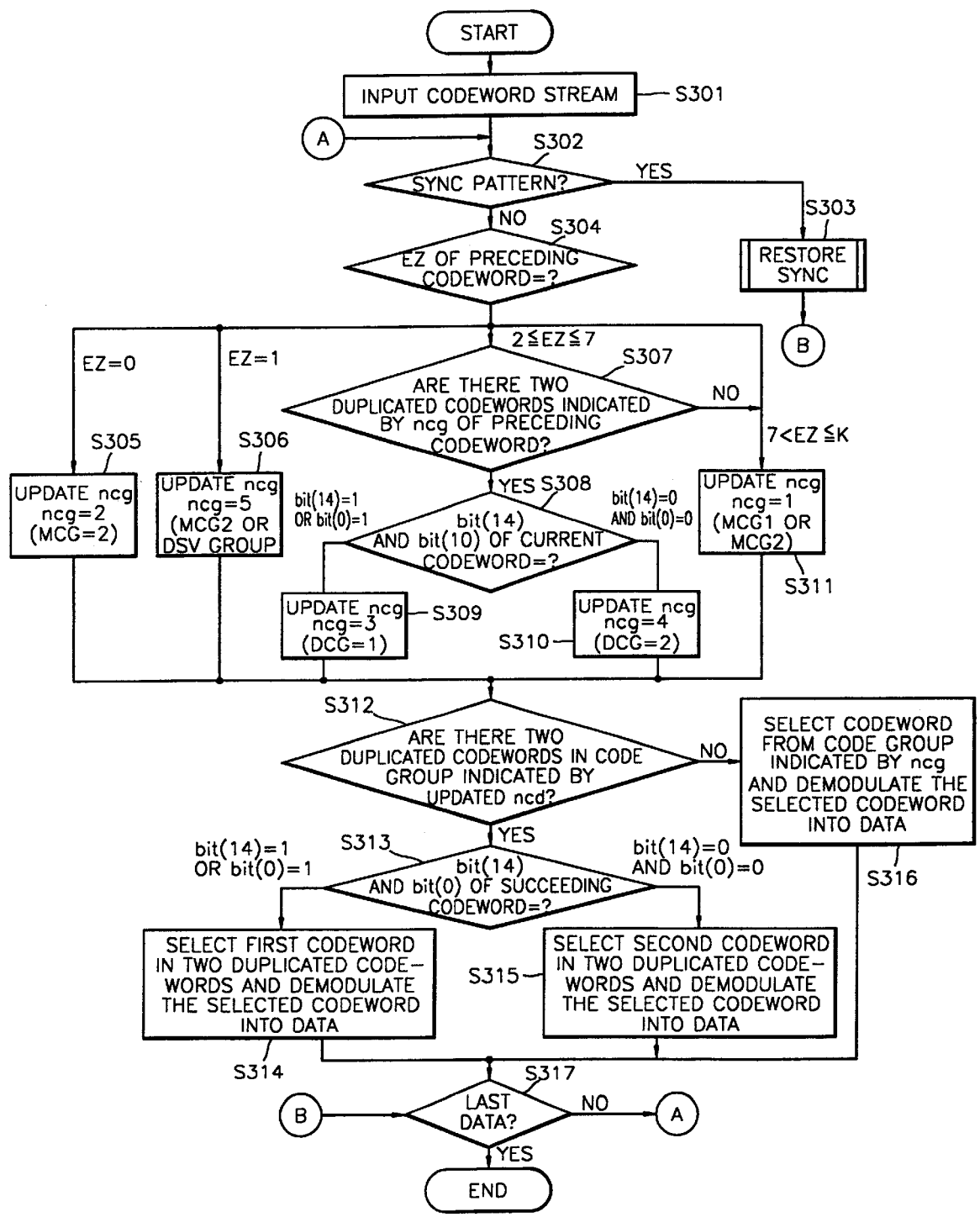
FIG. 10 is a flowchart showing an embodiment of a (2, 12, 8, 15) code demodulation method in which a code modulated by the method of FIG. 4 is demodulated into the original data.

FIG. 10 is a flowchart showing a (2, 12, 8, 15) code demodulation method according to an embodiment of the present invention, and will now be described in relation to FIG. 11.

A code word stream read from an optical disk is reproduced in synchronization with a reproduction clock signal. Examples of synchronization codes are shown in FIG. 5, and an example of a synchronization detector is shown in FIG. 11.

Figure 11:
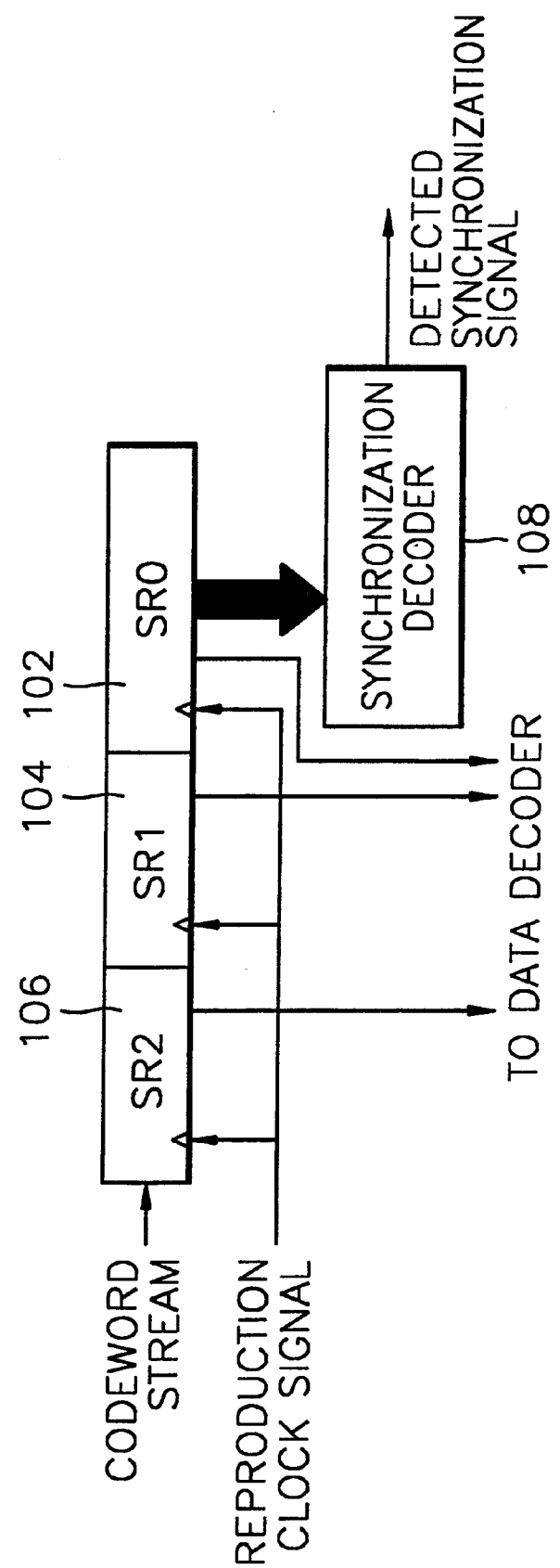
FIG. 11 illustrates a circuit diagram of a synchronization detector to explain step S302 of FIG. 10 in which the synchronization pattern is detected.

A code word stream which is serially input is shifted into $1^{st}$, $2^{nd}$, and $3^{rd}$ shift registers SR0, SR1, and SR2, respectively, referred by reference numerals 102, 104 and 106, respectively, as shown in FIG. 11 and in step S301. The $2^{nd}$ and $3^{rd}$ shift registers 104 and 106 are, for example, 15-bit shift registers, and the $1^{st}$ shift register 102 is for checking the number of end zeros (EZ) in the preceding code word for decoding data. For the $1^{st}$ shift register 102, although a 12-bit length is long enough, the length can be extended for decoding a synchronization code word. The output of the $1^{st}$ shift register 102 is supplied to a synchronization decoder 108 and a data decoder (not shown in FIG. 11), and the outputs of the $2^{nd}$ and $3^{rd}$ shift registers 104 and 106 are supplied to the data decoder.

First, a synchronization pattern of FIG. 5 supplied by the $1^{st}$ shift register is decoded by the synchronization decoder 108 and a synchronization signal is detected. If the synchronization pattern is detected by the synchronization decoder 108 in step S302, a synchronization restoration routine for synchronization protection and insertion, which is not shown in the present invention, is carried out in step S303. In the step S303, it is decided whether to use the synchronization signal detected by the synchronization decoder 108 without change, or to insert a pseudo synchronization code, by determining whether the synchronization signals are correctly detected.

Next, the process for finding an ncg which indicates a code group, which includes a code word to be modulated and supplied from the $2^{nd}$ shift register 104, will now be described. After performing the synchronization restoration routine in the step S303, step S317, which determines whether it is the last data or not is performed after updating the ncg to 1. In the step 302, if the code word stored in the shift register 102 is not a synchronization code, the EZ of the preceding code word is checked in step S304. If the EZ is 0, the ncg is updated to 2 in step S305 and if the EZ is 1, the ncg is updated to 5 in step S306. If the EZ satisfies $2 \leq EZ \leq 7$, it is determined whether two duplicated code words exist in the code group pointed out by the ncg of the preceding code word in step S307.

In the step S307, if two duplicated code words exist in the code group pointed out by the ncg of the preceding code word stored in the $1^{st}$ shift register 102, the MSB(bit 14) and the LSB(bit 0) of the code word to be modulated in the $2^{nd}$ shift register 104 are checked in step S308. If either the MSB or the LSB is "1", the ncg is updated to 3 in step S309, and if both are "0", the ncg is updated to 4 in step S310.

If the EZ of the preceding code word satisfies $2 \leq EZ \leq 7$ and there are no duplicated code words in the code group pointed out by the preceding ncg, or if the EZ satisfies $7 < EZ \leq k$, the ncg is updated to 1 in the step S307.

Next, a process for decoding the output of the $2^{nd}$ shift register 104 which stores the code word to be demodulated will now be described.

In step S312, it is checked whether or not two duplicated code words the same as the code word to be demodulated exist in the code group pointed out by the updated ncg. If two duplicated code words exist in the step S312, the MSB(bit 14) and the LSB(bit 0) of the succeeding code word supplied from the $3^{rd}$ shift register 106 are checked in step S313, and if either the MSB or the LSB is "1", it is determined that the current code word to be demodulated supplied from the $2^{nd}$ shift register 104 is the first code word of the duplicated code words, and corresponding original data is demodulated in step S314.

If both the MSB (bit 14) and the LSB (bit 0) of the succeeding code word supplied from the $3^{rd}$ shift register 106 are "0" in the step S313, it is determined that the current code word to be demodulated supplied from the $2^{nd}$ shift register 104 is the second code word in the duplicated code words, and corresponding original data is demodulated in step S315.

If a code word as supplied from the $2^{nd}$ shift register 104 exists in the code group pointed out by the updated ncg in the step S312 is not a duplicated code, the code word corresponding to the current code word to be demodulated, in the code group pointed out by the updated ncg is demodulated to the original data in step S316. As shown in FIG. 7; if the ncg is 1, the code group which includes the next code word is the MCG1 or the MCG2; if the ncg is 2, the code group which includes the next code word is the MCG2; if the ncg is 3, the code group which includes the next code word is the DCG1; if the ncg is 4, the code group which includes the next code word is the DCG2, and; if the ncg is 5, the code group which includes the next code word is the MCG2 or the DSV group.

As described above, according to the present invention, some of the code words which are already used in main code groups are used for sub-code groups (DSV groups) for suppressing the DC component, and the main code group is generated by using the characteristics (for example, CSV and INV parameters) of the code words of the main code group to the maximum, thus reducing the number of code word bits necessary to improve the recording density and increasing the DC suppression capability.

In addition, when DSV control is performed taking into consideration the INV parameter according to the present invention, that is, when DSV control by a look-ahead method is performed in infrequent code words of which DSV control is possible, the code words which are allocated to have inverse INV parameters achieve an improvement of several dB.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of generating a run length limited (RLL) code which is represented by (d, k, m, n), wherein d, k, m, and n denote a minimum run length, a maximum run length, a length of data bits, and a length of code word bits, respectively, the method comprising:
   (a) generating a code word which satisfies the (d, k) run length constraint; and
   (b) allocating main code groups, wherein the generated code word is duplicatable and allocated in one of the main code groups depending on characteristics of the generated code word, and code words of each main code group are allocated based upon a code word sum value (CSV) parameter, which represents a direct current (DC) value in a corresponding code word, and the characteristic of an INV parameter, which predicts the transition direction of a digital sum value (DSV) of a next code word, and allocating decision code groups for differentiating duplicated code words.

2. The method of claim 1, wherein in the step (b), additionally allocating one or more DSV groups, each of which comprises a plurality of code words of the one main code group.

3. The method of claim 1, further comprising:
   (c) determining a next code group so that another code word wherein suppression of DC component in a code word stream is controlled is allocated to be the next code word depending on a number of end zeros (EZ) of the generated code word.

4. The method of claim 2, wherein the main code groups comprise first and second main code groups, wherein the first main code group comprises code words of which a number of lead zeros (LZ) is less than a main code group division parameter (x), the second main code group comprises code words of which a number of LZ is equal to or more than x, no code words in the first main code group and the second main code group are the same; and the code words in which a number of end zeros (EZ) of the generated code word is equal to or more than the minimum run length (d) and less than or equal to a code word duplication parameter (y) are duplicated.

5. The method of claim 4, wherein the RLL code is (2, 12, 8, 15), the main code group division parameter (x) is 1, and the code word duplication parameter (y) is 7.

6. The method of claim 4, wherein to efficiently suppress the DC component in a code word stream, allocating the code words of the first main code group and the code words of the second main code group so that two code words, which are in the first main code group and the second main code group, correspond to a same decoded value, have opposite CSV parameters and, if possible, opposite characteristics of INV parameters; if the INV parameter is "0," updating the DSV value by adding the CSV value of a succeeding code word to a cumulated DSV value; and if the INV parameter is "1," updating the DSV value by adding the CSV value of the succeeding code word, after inverting a sign of the CSV value, to the cumulated DSV value.

7. The method of claim 4, wherein the one or more DSV groups comprise ones of the code words of the first main code group, the ones of the code words suppressing the DC component of a code word stream and controlling the (d, k) run length.

8. The method of claim 7, further comprising allocating the code words of the one or more DSV groups so that the code words have opposite signs of CSV, which represent a DC value in the corresponding code word, and INV, which predicts a transition direction of DSV of the succeeding code word, compared to the code words of the second main code group.

9. The method of claim 4, wherein, when EZ(p), which is the EZ value of a preceding code word, can not select the first main code group and can select only the second main code group, performing DC component suppression control by a DSV group which comprising ones of the code words whose LZ is equal to the main code group division parameter (x) if LZ(c), which is the LZ of a current code word, satisfies $d \leq EZ(p)+LZ(c) \leq k$.

10. The method of claim 1, wherein the decision code groups include a first decision group and a second decision code group, and the first and second decision code groups comprise ones of the code words whose number of lead zeros is less than or equal to a difference between the maximum run length (k) and a code word duplication parameter (y); the method further comprising allocating ones of the code words to the first decision code group or the second decision code group depending on values of predetermined bits of the ones of the code words.

11. The method of claim 2, wherein, depending on a number of lead zeros (LZ), allocating the code words of the one or more DSV groups in order that the code words whose LZ is a main code group division parameter (x) are allocated to the first DSV group; code words whose LZ is x or x−1 are allocated to the second DSV group; and the code words whose LZ is x or x−1, or, . . . , x−1 are allocated to the th DSV group, and selecting the code word whose EZ(p), which is the EZ value of the preceding code word, is EZ(p)=0, EZ(p)=1, . . . , EZ(p)=1, from the second main code group, the first DSV group, the second DSV group, . . . , the th DSV group, respectively, to perform DC suppression control.

12. The method of claim 2, wherein the step (b) comprises:
(b1) checking a number of lead zeros (LZ) of the generated code words;
(b2) allocating the code words whose LZ is less than the main code group division parameter (x) to a first one of main code groups;
(b3) allocating the code words whose LZ is equal to or more than the parameter x to a second one of the main code groups which comprises the code words whose CSV parameter which represents the DC value in the corresponding code word and the INV parameter which predicts a transition direction of the next code word have opposite characteristics to the code words of the first main code group;
(b4) allocating the code word, whose LZ is less than or equal to the difference between the maximum run length (k) and a code word duplication parameter (y) when "1" exists in predetermined bits of the code word, to a first one of the decision code groups, and allocating the code word, whose LZ is less than or equal to the difference between the maximum run length (k) and the code word duplication parameter (y) when the predetermined bits are all is "0", to a second one of the decision code groups; and
(b5) allocating the code words whose LZ is the same as the main code group division parameter (x) to a first DSV group which comprises the code words which belong to the first main code group.

13. The method of claim 12, wherein the step (b) further comprises:
(b6) allocating the code words whose LZ is x, or x−1 to the second DSV group, and allocating the code words whose LZ is x, x−1, . . . , or x−1 to the th DSV group.

14. The method of claim 3, wherein the step (c) comprises:
(c1) checking the EZ of the generated code word;
(c2) performing a DC control of a code word stream after determining a second one of the main code groups or one or more DSV groups as the next code group which follows the generated code word if the EZ satisfies 0≦EZ≦d;
(c3) performing the DC control of the code word stream after determining a first one of the decision code groups or a second one of the decision code groups as the next code group which follows the duplicated code words, and determining a first or a second one of the main code groups as the next code group which follow the code words which are not duplicated, if the EZ satisfies d≦EZ≦y, wherein y is a code word duplication parameter; and
(c4) performing the DC control of the code word stream after determining the first or the second main code group as the next code group which follows the generated code word unless the (d, k) run length constraint is violated if the EZ satisfies y≦EZ.

15. The method of claim 14, further comprising determining the second main code group as the next code group which follows the generated code word if the EZ is "0," and otherwise determining one of the one or more DSV groups as the next code group when the EZ satisfies 0≦EZ≦d.

16. A method of modulating data input to an optical disc recording and/or reproducing device into a run length limited (RLL) code which is represented by (d, k, m, n), wherein d, k, m, and n denote a minium run length, a maximum run length, a length of data bits, and a length of code word bits, respectively, the modulating method comprising:
(a) modulating m-bit input data into a code word after selecting the code word in a code group among main code groups wherein the code words are duplicatable and the code words of each main code group are allocated based upon a code word sum value (CSV) parameter which represents a direct current (DC) value in a corresponding one of the code words and the characteristic of an INV parameter which predicts a transition direction of a digital sum value (DSV) of a next code word, and decision code groups for differentiating the duplicated code words.

17. The modulating method of claim 16, wherein the step (a) further comprises modulating the input data by additionally using one or more DSV groups each comprising some code words of a first one of the main code groups.

18. The modulating method of claim 17, further comprising:
(b) selecting a code word corresponding to the input data in the step (a) in a next code group pointed out by a preceding code word, and updating the next code group with a new next code group pointed out by the selected code word.

19. The modulating method of claim 18, wherein the step (b) further comprises:
(b1) checking the next code group pointed out by the preceding code word;
(b2) checking whether the (d, k) run length constraint is satisfied if the checked result in the step (b1) indicates that the next code group pointed out by the preceding code word is a first one of the main code groups;
(b3) if the (d, k) run length constraint is satisfied, selecting one of the code word corresponding to the input data from one of the code groups that is advantageous to DC control between the first and second main code groups, and updating the next code group with a next code group pointed out by the selected code word, and, if the (d, k) run length constraint is not satisfied, selecting one of the code word from the first main code group and updating the next code group with the next code group pointed out by the selected code word;
(b4) selecting one of the code words corresponding to the input data from the second main code group if the checked result in the step (b1) indicates that the next code group pointed out by the preceding code word is the second main code group, and updating the next code group with a new next code group pointed out by the selected code word;

(b5) selecting one of the code words corresponding to the input data from a first one of the decision code groups if the checked result in the step (b1) indicates that the next code group pointed out by the preceding code word is a first one of the decision code groups and updating the next code group with the new next code group pointed out by the selected code word;

(b6) selecting one of the code words corresponding to the input data from a second one of the decision code groups if the checked result in the step (b1) indicates that the next code group pointed out by the preceding code word is a second one of the decision code groups and updating the next code group with the new next code group pointed out by the selected code word; and (b7) if the result of the checking in the step (b1) indicates that the next code group pointed out by the preceding code word is one of the DSV groups, determining whether the input data is less than or equal to a predetermined value, and, if the input data is less than or equal to the predetermined value, selecting one of the code words from one of the code groups that is advantageous to DC control between the second main code group and one of DSV groups and updating the next code group with a next code group pointed out by the selected code word, and, if the input data is more than the predetermined value, selecting one of the code words from the second main code group and updating the next code group with the new next code group pointed out by the selected code word.

20. The modulating method of claim 16, further comprising:

(b) inserting a synchronization pattern in a code word stream of the RLL code in each of a plurality of predetermined periods, wherein, if a frequency of synchronization patterns in use is frequent, the synchronization pattern uses an extended don't care bit in order to efficiently control DC in a code word stream of the RLL code and has a most significant bit set as a don't care bit.

21. A method of demodulating a run length limited (RLL) code into original data, the RLL code being represented by (d, k, m, n) wherein d, k, m, and n denote a minium run length, a maximum run length, a length of data bits, and a length of code word bits, respectively, wherein the RLL code of a code word is modulated from m-bit input data after selecting the code word in a code group among main code groups wherein the code words are duplicatable and code words of each main code group are allocated based upon a code word sum value (CSV) parameter which represents a direct current (DC) value in a corresponding one of the code words and a characteristic of an INV parameter which predicts a transition direction of a digital sum value (DSV) of a next code word, and decision code groups for differentiating the duplicated code words, the demodulating method for an optical disc recording and/or reproducing device comprising:

(a) inputting a code word stream, and updating a parameter ncg, which indicates a group to which one of the code words to be demodulated belongs, according to characteristics of a preceding one of the code words;

(b) demodulating the code word to be demodulated in the code group pointed out by the updated ncg into the original m-bit data if two duplicated current code words do not exist in the code group pointed out by the updated ncg.

22. The demodulating method of claim 21, further comprising:

(c) checking predetermined bits of the next code word if two duplicated current code words exist in the code group pointed out by the updated ncg, and demodulating a first one of the two duplicated code words into the original data if the predetermined bits include "1," and demodulating a second one of the two duplicated code words into the original data if the predetermined bits are all "0."

23. The demodulating method of claim 21, further comprising:

(c) demodulating a synchronization code word after determining that an input code word is a synchronization pattern, and initializing an ncg to indicate one of the code groups.

24. The demodulating method of claim 21, wherein the modulated RLL code is modulated by additionally using one or more DSV groups which comprise some code words of the main code groups, the main code groups comprise first and second main code groups, and the decision code groups comprise first and second decision code groups.

25. The demodulating method of claim 24, the step (a) further comprising:

(a1) determining number of end zeros (EZ) of the preceding code word;

(a2) updating the ncg with the second main code group if the EZ of the preceding code word is "0";

(a3) updating the ncg with one that is more advantageous to DC control among the second main code group and the DSV groups if the EZ of the preceding code word is "1";

(a4) determining that two duplicated code words exist in the code group pointed out by the next code group of the preceding code word if the EZ of the preceding code word is equal to or more than the minimum run length (d) and less than or equal to a code word duplication parameter (y);

(a5) checking predetermined bits of the current code word if two duplicated code words exist in the step (a4), and updating the ncg with the first decision code group if the predetermined bits include "1," and updating the ncg with the second decision code group if the predetermined bits are all "0"; and (a6) updating the ncg with one that is more advantageous to DC control between the first main code group and the second main code group if the EZ of the preceding code word is more than the code word duplication parameter (y) and less than or equal to the maximum run length (k), or if two duplicated code words do not exist in the step (a4).

26. The demodulating method of claim 25, wherein the RLL code is (2, 12, 8, 15), the main code group division parameter (x) is 1, the code word duplication parameter (y) is 7, and the predetermined bits are the most significant bit and the least significant bit of the current code word.

27. The method of claim 4, further comprising allocating the code words of the first main code group and the DSV groups so as to have opposite CSV signs and INV parameters compared to the code words of the second main code group.

28. The method of claim 7, further comprising allocating the code words of the first main code group and the DSV groups so as to have opposite CSV signs and INV parameters compared to the code words of the second main code group.

29. The method of claim 19, further comprising allocating the code words of the first main code group and the DSV groups so as to have opposite CSV signs and INV parameters compared to the code words of the second main code group.

30. The method of claim 24, further comprising allocating the code words of the first main code group and the DSV groups so as to have opposite CSV signs and INV parameters compared to the code words of the second main code group.

31. The modulating method of claim 16, further comprising:

updating the DSV by adding the CSV of a next code word to the DSV value cumulated previously after inverting a sign of the CSV; and selecting the cumulated DSV of a code word stream of the RLL code nearest to "0" for the modulating of the input data.

32. The modulating method of claim 20, further comprising:

updating the DSV by adding the CSV of a next code word to the DSV value cumulated previously after inverting a sign of the CSV; and selecting the cumulated DSV of a code word stream of the RLL code nearest to "0" for the modulating of the input data.

33. A method of generating a run length limited (RLL) code which is represented by (d, k, m, n), wherein d, k, m, and n denote a minimum run length, a maximum run length, a length of data bits, and a length of code word bits, respectively, the method comprising:

generating a main conversion table having code words using a code word sum value (CSV) parameter and an INV, which is a code word characteristic parameter of the main conversion table;

generating a sub conversion table using at least some of the code words already used in the main conversion table for DC compression of the RLL code; and generating a code word which satisfies the (d, k) run length constraint in accordance with the main and sub conversion tables.

34. The method of claim 33, wherein the code word characteristic parameter is for predicting a transition direction of a digital sum value of a next code word.

35. The method of claim 33, wherein the generating of the code word comprises extracting ones of the code words from the main and sub conversion tables based upon a number of lead zeros, a number of end zeros of the code words of the main and sub conversion tables which satisfy the (d, k) run length constraint.

* * * * *